United States Patent [19]
Chitayat

[11] Patent Number: 5,723,917
[45] Date of Patent: Mar. 3, 1998

[54] FLAT LINEAR MOTOR

[75] Inventor: Anwar Chitayat, Northport, N.Y.

[73] Assignee: Anorad Corporation, Hauppage, N.Y.

[21] Appl. No.: 346,860

[22] Filed: Nov. 30, 1994

[51] Int. Cl.$^6$ .................................................. H02K 41/00
[52] U.S. Cl. ................................................................ 310/12
[58] Field of Search ................................. 310/12, 13, 27, 310/54, 42, 43

[56] References Cited

U.S. PATENT DOCUMENTS

| | | | |
|---|---|---|---|
| 3,842,751 | 10/1974 | Thorton et al. | 104/148 SS |
| 4,135,106 | 1/1979 | Jollois | 310/105 |
| 4,471,247 | 9/1984 | Cotton | 310/45 |
| 4,620,253 | 10/1986 | Garwin et al. | 360/107 |
| 4,749,921 | 6/1988 | Chitayat | 318/135 |
| 4,839,545 | 6/1989 | Chitayat | 310/12 |
| 4,916,340 | 4/1990 | Negishi | 310/12 |
| 4,965,864 | 10/1990 | Roth et al. | 318/135 |
| 5,130,583 | 7/1992 | Andoh | 340/12 |
| 5,179,304 | 1/1993 | Kenjo et al. | 310/12 |
| 5,309,049 | 5/1994 | Kawada et al. | 310/12 |
| 5,402,021 | 3/1995 | Johnson | 310/12 |

Primary Examiner—Thomas M. Dougherty
Assistant Examiner—Jonathan Link
Attorney, Agent, or Firm—Morrison Law Firm

[57] ABSTRACT

A flat linear motor has a single row of permanent magnets mounted upon backplate and an armature having non-overlapping flat coils encapsulated in a block of epoxy resin mounted upon an armature backplate comprised of a magnetic material and having anchoring recesses or protrusions. The armature backplate serves to provide magnetic circuits of low magnetic resistance in the flat linear motor thereby increasing a force generated by the linear motor. A length of the armature backplate is a non-integral number of a pitch length of the permanent magnets so as to reduce cogging. The three non-overlapping flat coils are comprised of square wire windings which provide increased thermal conduction. An embodiment of the invention employs software commutation wherein a position sensing device is used by a controller to determine a position of the armature from which a field polarity is found by means of a formula or a look-up table. Further embodiments of the invention have a cooling manifold, magnetic flux focusing armature backplates, and a modified Halbach magnet array.

25 Claims, 13 Drawing Sheets

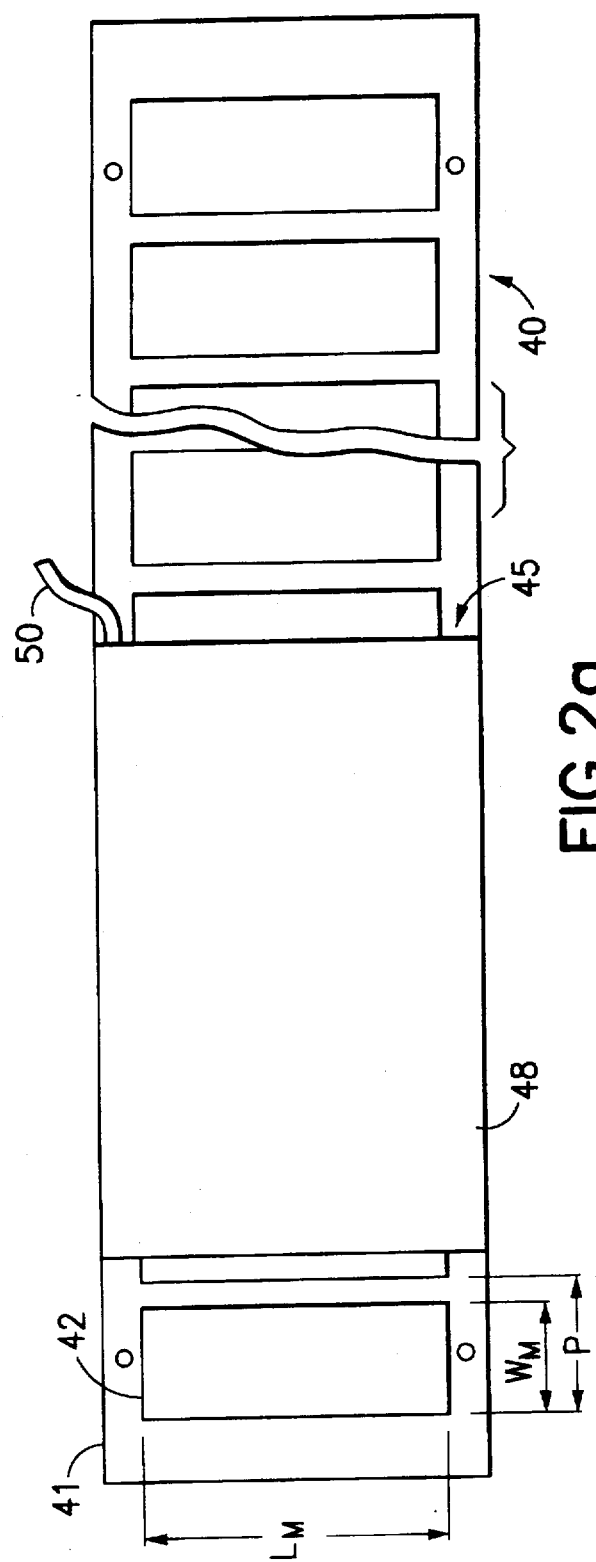

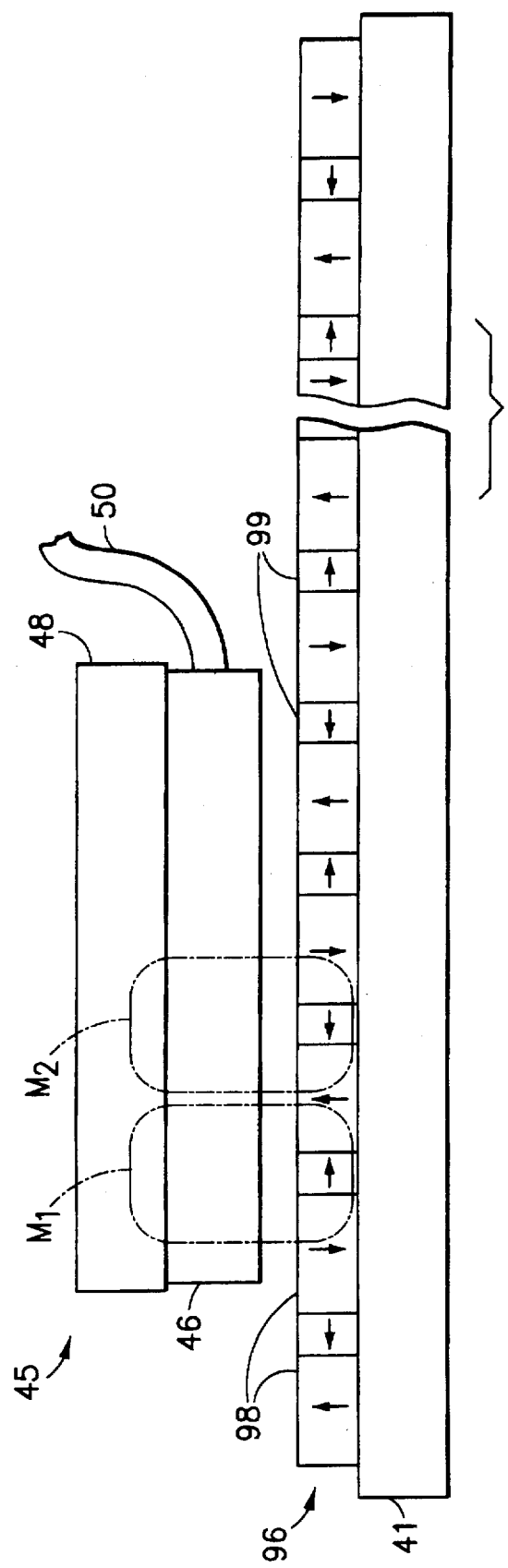

FLAT LINEAR MOTOR

BACKGROUND OF THE INVENTION

The present invention relates to a linear motor and, more particularly, to a linear motor having non-overlapped coils mounted upon a non-laminated backplate, formed from magnetic material, which travels relative to a single row of permanent magnets.

Linear motors employing toothed armatures comprised of laminates of magnetic material such as steel are known. One such motor is disclosed in U.S. Pat. No. 4,733,143. A traveling member having a row of permanent magnets moves relative to a toothed armature. The magnetic laminates serve to reduce eddy current loses in the armature while providing a medium of high magnetic permeability so that a magnetic flux density B in the toothed armature is maintained at a high level. Such an armature has overlapped coils formed from round wire that are inserted between teeth of the toothed armature and locked into place with a retainer strip. Construction costs of such an armature are high due to the expense of the materials employed and the complexity of assembling the magnetic laminates and insertion of the coils. Additionally, such armatures experience an effect known in the art as cogging.

Linear motors having a non-magnetic armature operating in conjunction with a generally U-shaped frame are known. One such linear motor is disclosed in U.S. Pat. No. 4,749,921 which is herein incorporated by reference. The U-shape frame includes two rows of opposing permanent magnets on respective inner surfaces of sides of the U-shaped frame. The use of the non-magnetic armature frees the armature of magnetic forces that would otherwise attract it to the magnets on one of the sides of the U-shaped frame. Thus, a slidable support mechanism for the non-magnetic armature need not be constructed so as to resist the magnetic forces. Furthermore, cogging effects are reduced due to the absence of magnetic materials in the non-magnetic armature. Additionally, drag that is created by the inducement of eddy currents in the magnetic armatures is similarly reduced. While the effects of reduced drag and cogging are advantageous, the two rows of opposing magnets and the U-shaped frame increase assembly and construction costs of the linear motor thereby preventing its use in low cost applications.

The above linear motors employ commutation devices effecting direct commutation via brushes contacting commutation electrode segments along the path of travel, and indirect commutation using hall effect sensors in the armature sensing a polarity of a magnetic field created by the opposing magnets, or opto-electric sensors moving relative to a slotted member with slots combinatorially aligned with the opposing magnets. A control device receives signals from the sensors and energizes the coils in the armature accordingly. In addition to the commutation devices, the linear motors are further equipped with position sensing devices such as interferometers or scanned optical gratings. The control device is then used to drive the motor to a desired position as sensed by a chosen position sensing device. The incorporation of both commutation sensors or brushes and a position sensing device further contributes to assembly and material costs incurred in the production of such linear motors.

OBJECTS AND SUMMARY OF THE INVENTION

Accordingly, it is an object of the invention to provide a flat linear motor which overcomes the drawbacks of the prior art.

It is a further object of the invention to provide a flat linear motor for use in low cost applications such as linearly driving printer heads in commercial printers including those of the dot matrix variety.

It is a still further object of the invention to provide a flat linear motor having a single row of permanent magnets and an armature comprised of non-overlapping coils epoxy encapsulated upon a magnetic armature backplate.

Yet another object of the present invention is to provide a flat linear motor having a low parts count and reduced assembly complexity providing in a reduced total cost of manufacture.

Furthermore, it is an object of the present invention to provide a low cost flat linear motor having an armature backplate with a length equal to a non-integral number of pitch lengths of permanent magnets in the motor such that cogging is reduced.

Briefly stated, there is provided a flat linear motor having a single row of permanent magnets mounted upon backplate and an armature having non-overlapping flat coils encapsulated in a block of epoxy resin mounted upon an armature backplate comprised of a magnetic material. The magnetic backplate serves to provide magnetic circuits of low magnetic resistance in the flat linear motor thereby increasing a force generated by the linear motor. A length of the armature backplate is a non-integral number of a pitch length of the permanent magnets so as to reduce cogging. The non-overlapping flat coils are optionally comprised of square wire windings which provide increased thermal conduction. An embodiment of the invention employs software commutation wherein a position sensing device is used by a controller to determine a position of the armature from which a field polarity is found by means of a formula or a look-up table.

In accordance with these and other objects of the invention, there is provided a flat linear motor comprising: a single row of permanent magnets mounted upon a backplate of magnetic material, an armature assembly, the armature assembly including a non-magnetic armature block, the armature block including coils, an armature backplate composed of a magnetic material, and the armature block being affixed upon the armature backplate.

According to another feature of the invention, there is provided a flat linear motor as recited above wherein the armature backplate has a length equal to a non-integral number of pitch lengths of the row of permanent magnets such that cogging is reduced.

According to a still further feature of the invention, there is provided a flat linear motor as recited above further comprising: a position sensing device for sensing a position of the armature assembly relative to an initialization position, a controller receiving signals from the position sensing device, the controller determining the position of the armature assembly, the controller determining a field polarity of the permanent magnets at the position by means of one of a formula and a look-up table, and the controller driving the coils in accordance with the field polarity at the position.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 2a is a front view of a flat linear motor of the present invention.

FIG. 2b is a side view of the flat linear motor in FIG. 2a.

FIG. 2c is a top view of the flat linear motor in FIG. 2a.

FIG. 6b is a top view of the armature assembly of FIG. 6a.

FIG. 7b is a top view of the armature assembly of FIG. 7a.

FIG. 9 is a top view of a flat linear motor of the present invention incorporating a modified Halbach array.

DETAILED DESCRIPTION OF THE PREFERRED EMBODIMENT

Figure 1:
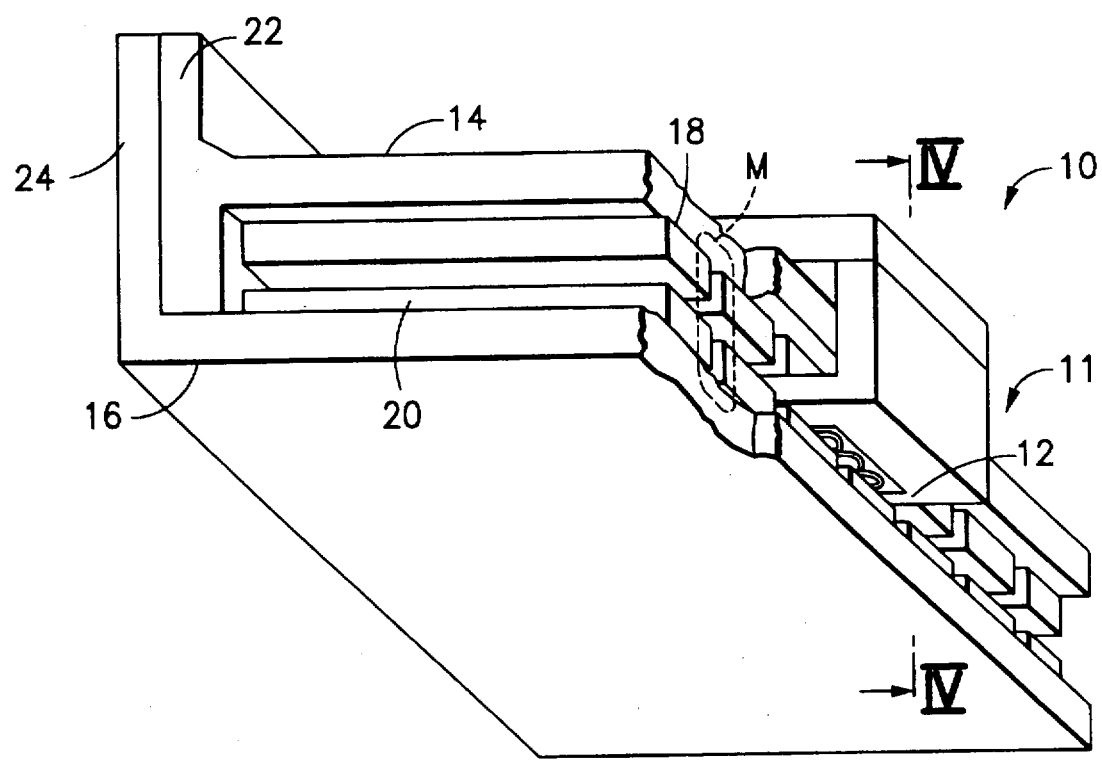
FIG. 1 is a bottom perspective view of a linear motor of the prior art having a non-magnetic armature.

Referring now to FIG. 1, there is shown a bottom perspective view of a linear motor 10 of the prior art having an armature assembly 11 including a non-magnetic armature plate 12. The non-magnetic armature plate 12 travels in a generally U-shaped channel comprised, of an upper magnet mount plate 14 and a lower magnet mount plate 16. A first plurality of magnets 18 are affixed to the upper magnet mount plate 14 and a second plurality of magnets 20 are affixed to the lower magnet mount plate 16. The upper and lower magnet mount plates, 12 and 14, are joined together via flange sections 22 and 24. The major flux path of the magnetic circuit of the motor is indicated by the dashed line M.

The magnetic flux density B between the first and second pluralities of magnet, 18 and 20, is dependent upon the magnetic field intensity H of the first and second pluralities of magnets, 18 and 20, and the magnetic resistance of the magnetic circuit which is determined by the magnetic permeabilities of materials comprising the circuit. The force produced by a current traveling in a magnetic field is from $$F = J \times B$$

where J is the current density. Power dissipated in a motor is determined from $$P = I^2 \times R_w$$

where I is the current traveling through the windings and $R_w$ is the resistance of the windings. Thus, since the power dissipated as heat increases with the square of the current, it is desirable to maximize the magnetic flux density B in order to increase the force output. Therefore the magnetic circuit is preferably constructed of materials having high magnetic permeabilities such that the magnetic flux density B is high in the area of the non-magnetic armature 12 allowing greater force to be produced by currents in the armature. The upper and lower magnet mount plates, 14 and 16, are formed from a magnetic material such as steel, having a high magnetic permeability, and a gap between the first and second pluralities of magnets, 18 and 20, is minimized. The use of the opposing first and second pluralities of magnets, 18 and 20, and the steel upper and lower magnetic mounts plates, 14 and 16, produce a high magnetic flux density B in the gap. However, this construction increases the cost of materials and production due to the number of parts required and the complexity of assembly.

Magnetic materials traveling in a magnetic field experience eddy currents which effect a drag upon the materials and dissipate energy as heat in the magnetic materials. Armatures employing magnetic laminates, which reduce eddy current losses, still experience a cogging effect produced when such armatures passes through regions of alternating magnetic polarity. Magnetic laminates of silicon steel increase material costs and the complexity of assembly. The use of non-magnetic materials in the non-magnetic armature 12 reduces eddy current loses and thus reduces drag upon the armature assembly 11 and cogging effects.

Figure 2B:
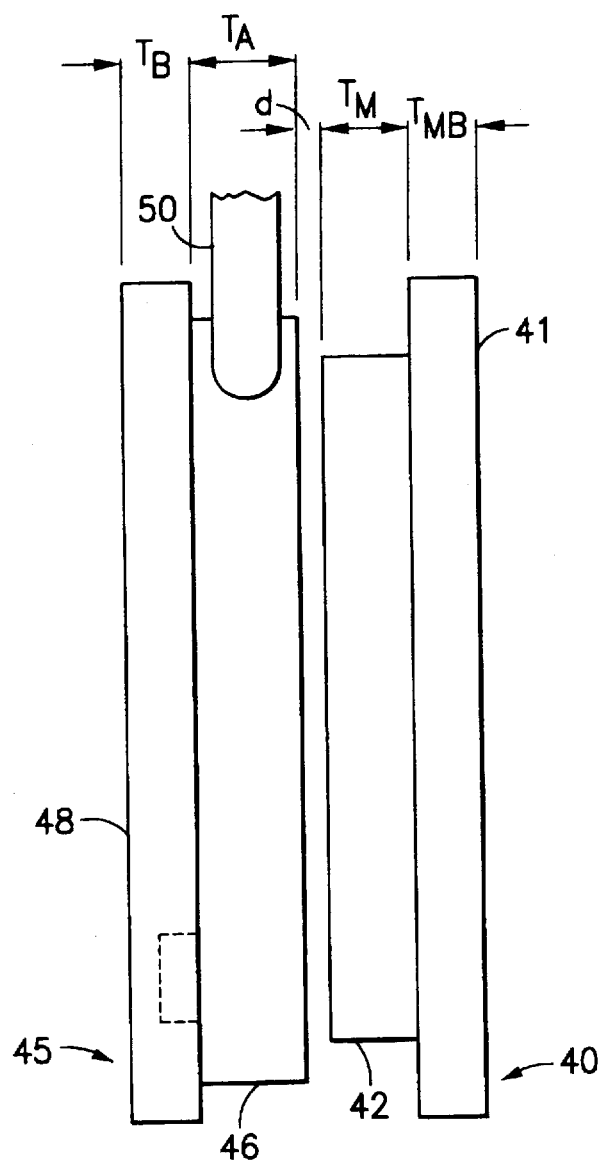
Figure 2C:
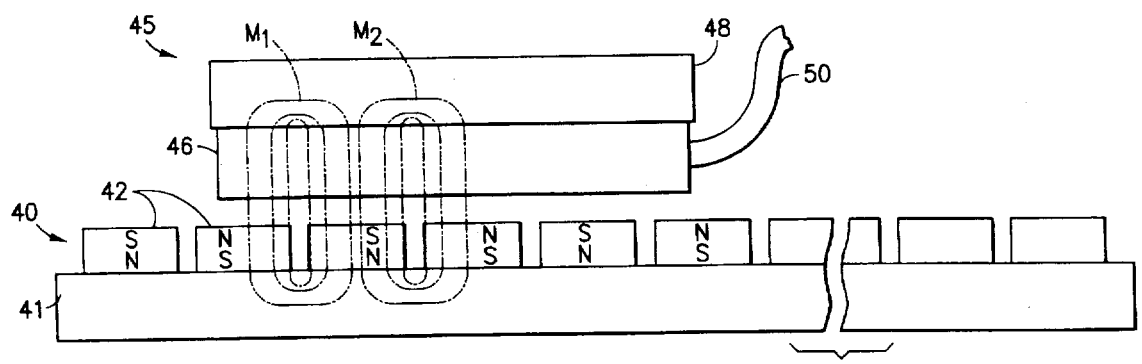

Referring to FIGS. 2a–2c, front, side and bottom views of an embodiment of a flat linear motor of present invention are shown. A magnet assembly 40 includes a magnet backplate 41 having a plurality of magnets 42 mounted upon it. An armature assembly 45 travels relative to the magnet assembly 40 and includes an armature block 46 mounted upon an armature backplate 48. The armature block 46 is comprised of three coils (not shown) encapsulated in a settable epoxy resin. A supply cable 50 carries current to the three coils of the armature block 46. Slidable support means for the armature assembly 45 are supplied by a user provided mechanism into which the flat linear motor is incorporated.

In a preferred embodiment the magnets 42 have a pitch P of 0.75", a width $W_M$ of 0.5" to 0.6", a length $L_M$ of 2" and a thickness $T_M$ of 0.5" minimum while the magnet backplate 41 has a thickness $T_{MB}$ equal to 0.25". The armature backplate 48 has a thickness $T_B$ of 0.375", the armature block 46 has a thickness $T_B$ of 0.3" which is substantially equal to a thickness of the coils. The armature assembly 45 is separated from the magnet assembly 40 by a distance d equal to 0.05". The above dimensions and those provided herein serve as examples and not limitations of the present invention. It is realized that the dimensions may be varied in absolute and relative terms, and such variations are considered to be within the scope and spirit of the present invention.

Referring to FIG. 2c, magnetic circuits M1 and M2 predominate in the flat linear motor and include the magnet backplate 41 and the armature backplate 48. Both the armature backplate 48 and the magnet backplate 41 are composed of high permeability materials, such as steel, so as to concentrate the magnetic field therein and minimize the magnetic resistances of the circuits. Furthermore, steel or silicon steel laminates are also used in place of the steel armature backplate in order to reduce eddy currents where necessitated by operational parameters. While the use of laminates increased the material costs, a resultant reduction in drag upon the armature assembly 45 allows use of the invention in applications requiring higher performance levels than solid steel backplates are capable of fulfilling.

Figure 3:
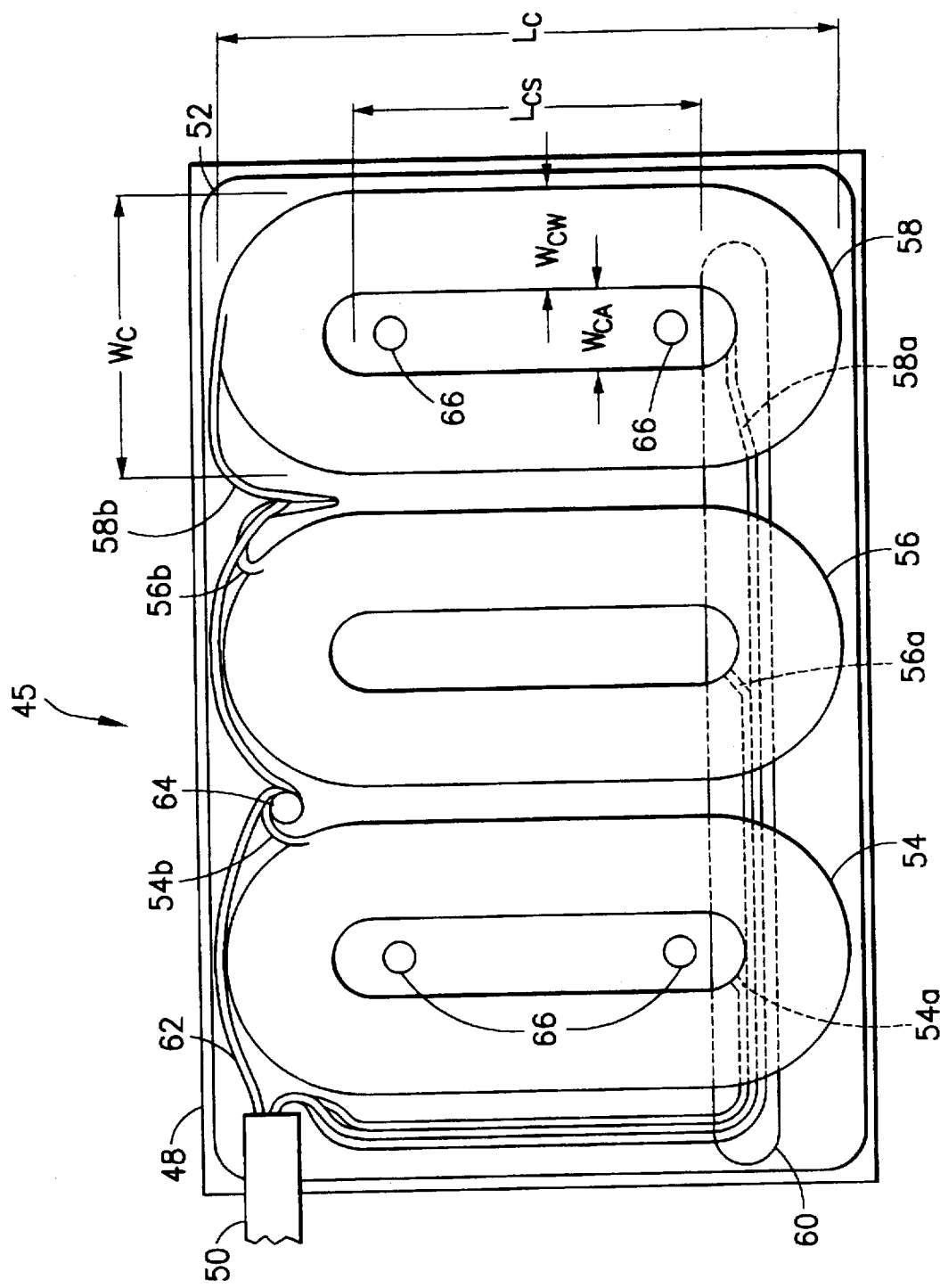
FIG. 3 is a rear view an armature assembly of the flat linear motor of FIG. 2a without an encapsulating epoxy resin body.

Referring to FIG. 3, a rear view of the armature assembly 45 is shown without the epoxy encapsulation. An insulating sheet 52 lays upon the armature backplate 48, separating and electrically insulating coils 54, 56, and 58, from the armature backplate 48. The insulating sheet 52 is laminated upon the armature backplate 48 and may optionally include a pattern of apertures (not shown) to allow an encapsulating epoxy to make structural and thermal contact with the armature backplate 48. The insulating sheet 52 is composed of materials, such as Kapton, which provide good thermal conductivity and maintain structural integrity under high temperatures. The coils 54, 56, and 58 are affixed upon the insulating sheet 52 using the encapsulation epoxy. In a preferred embodiment the coils 54, 56, and 58 have an overall length $L_C$ of 3", a straight portion length $L_{CS}$ of 2", an overall width $W_C$ of 1" including a coil winding width $W_{CW}$ of 0.3" and a remaining coil aperture width $W_{CA}$ of 0.4".

First coil leads 54a, 56a, and 58a, extend from beneath coils 54, 56, and 58, respectively, and are carried in a recess 60, formed in the armature backplate 48. The first coil leads 54a, 56a, and 58a, join with conductors of supply cable 50 which pass through an aperture in the insulating sheet 52 contiguous with the recess 60. A return lead 62 of the supply cable 50 is connected to a ground terminal 64 mounted upon the armature backplate 48. Second coil leads 54b, 56b, and 58b, are connected to the ground terminal 64 completing supply circuits for coils 54, 56, and 58, respectively.

The coils 54, 56, and 58, are encapsulated in an epoxy which provides structural integrity and forms the armature block 46 shown in FIG. 2b. The epoxy is chosen to have superior thermal conductivity so as to dissipate heat away from the coils 54, 56, and 58 and includes settable resins such as "STYCAST 2850MT" produced by Emerson and Cumming, Inc. of Canton, Mass. Anchors 66 are installed into the armature backplate 48 such that they protrude from a surface of the armature backplate 48. When the epoxy is cast around the coils 54, 56, and 58, the anchors are also encapsulated into the epoxy and hold the armature block 46 to the armature backplate 48. The anchors 66 shown are depicted as screws, however, other types of protrusions from the surface can be utilized provided they present a configuration which the epoxy can lock onto. For instance, a threaded or knurled surface, or a inverted wedge shape provide sufficient locking configurations.

Another embodiment of the present invention employs grooves (not shown) in the armature backplate 48 into which the epoxy of the armature block 46 extends, thereby creating an interlocking structure which improves adhesion of the armature block 46 to the armature backplate 48. In such a configuration, back sides of the coils 54, 56, and 58, may be individually insulated with insulating sheets, of material to prevent electrical shorts to the armature backplate 48. Other configurations of recesses may also be used to create an interlocking structure between the armature block 46 and the backplate 48. For example, such recesses may include threaded holes, slanted holes, or dovetail holes or slots.

Figure 4A:
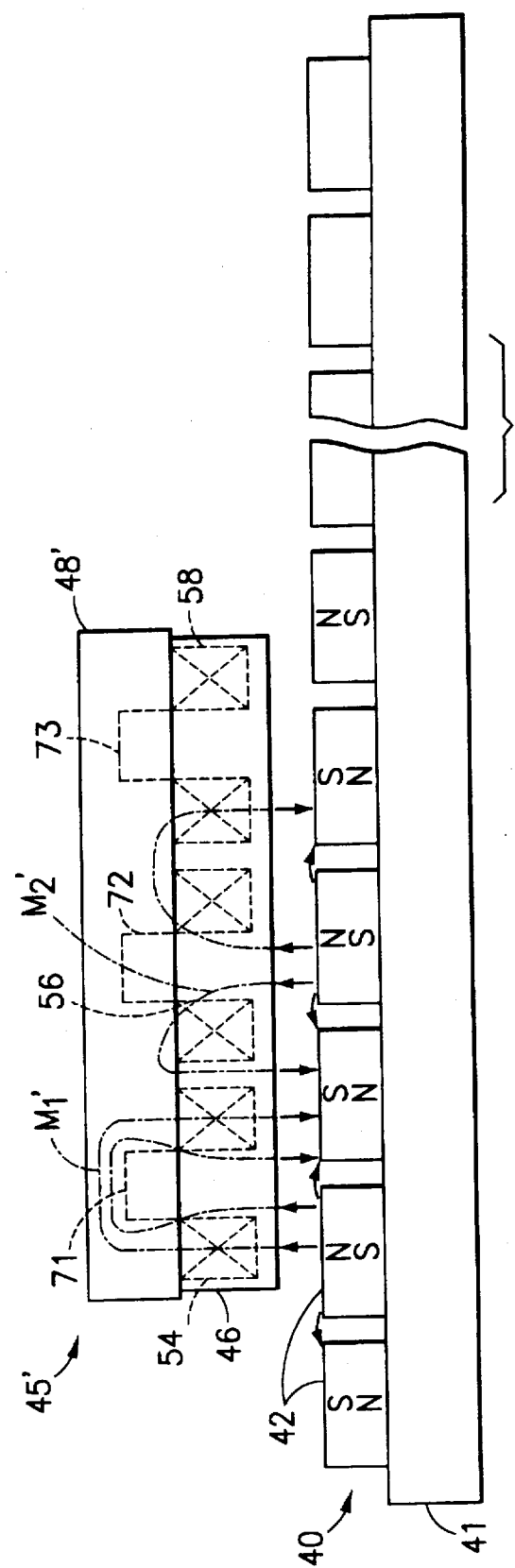
FIG. 4a is a top view of a flat linear motor of the present invention incorporating recesses in an armature backplate.
Figure 4B:
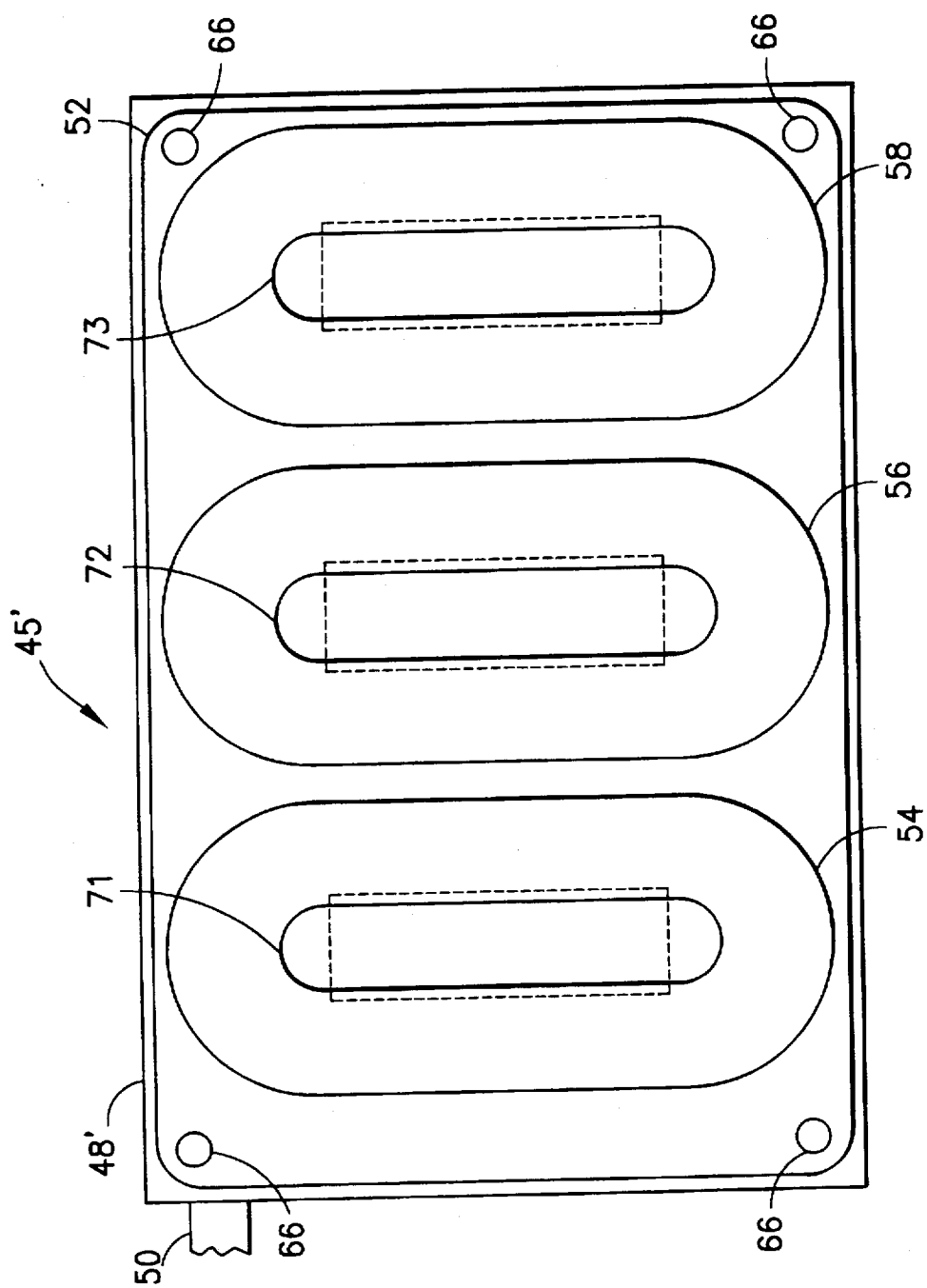
FIG. 4b is a rear view of an armature assembly of the flat linear motor of FIG. 4a without an encapsulating epoxy resin body.

Referring to FIGS. 4a and 4b, another embodiment of the present invention is shown having an armature backplate 48' with recesses 71, 72, and 73 situated above center openings of the coils 54, 56, and 58. In a motor it is desirable to maximize the magnetic flux density B in which the coils are positioned. The magnetic flux density B is increases with a magnetic permeability of a medium given a constant magnetic field intensity H. The magnetic permeability of the armature backplate 48' is far greater than that of air or epoxy. Therefore, the magnetic flux density B is greatest along straight lengths of the coils 54, 56, and 58, which are not located under the recesses 71, 72, and 73. The recesses 71, 72, and 73 are either epoxy filled or air filled. The lines of flux $M_1'$ are concentrated so as to follow a path of greatest magnetic permeability which excludes areas where the recesses 71, 72, and 73 are located. Thus, the recesses 71, 72, and 73, serve to focus the lines of the magnetic flux $M_1'$ through the straight lengths of the coils 54, 56, and 58. The magnetic circuit of flux $M_1'$ is completed through remaining portions of the armature backplate 48' above the recesses 71, 72, and 73. The anchors 66 are now positioned at corners of the armature backplate 48'.

Figure 5A:
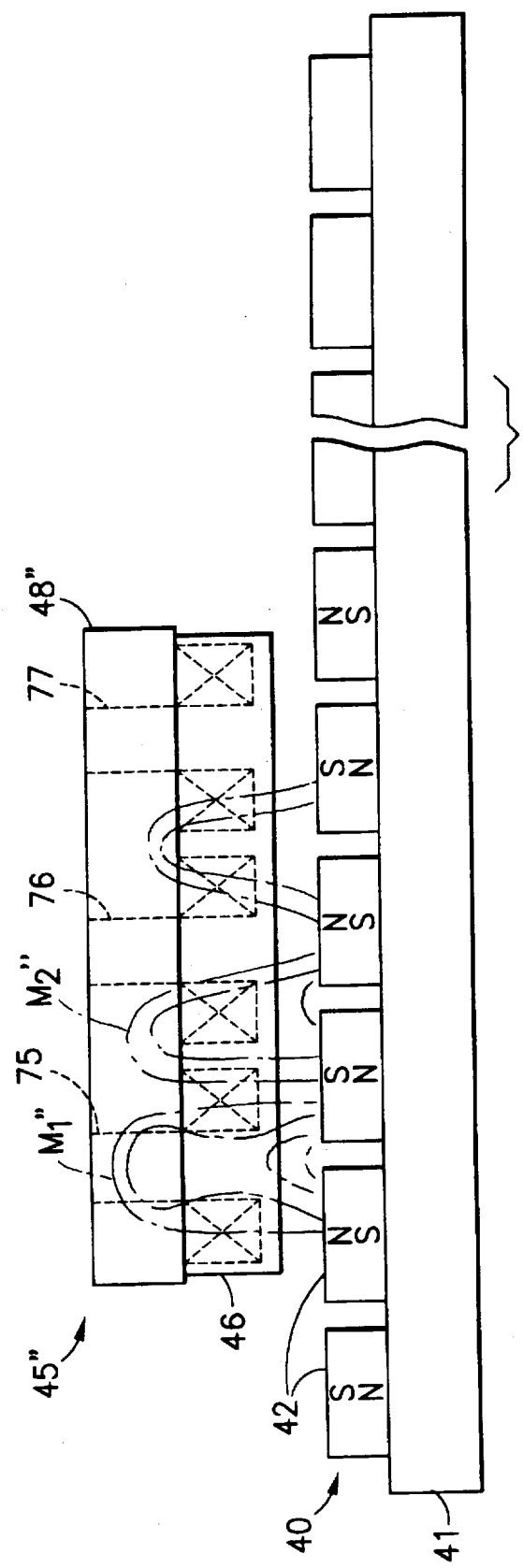
FIG. 5a is a top view of a flat linear motor of the present invention, having slots in an armature backplate showing magnetic flux lines.
Figure 5B:
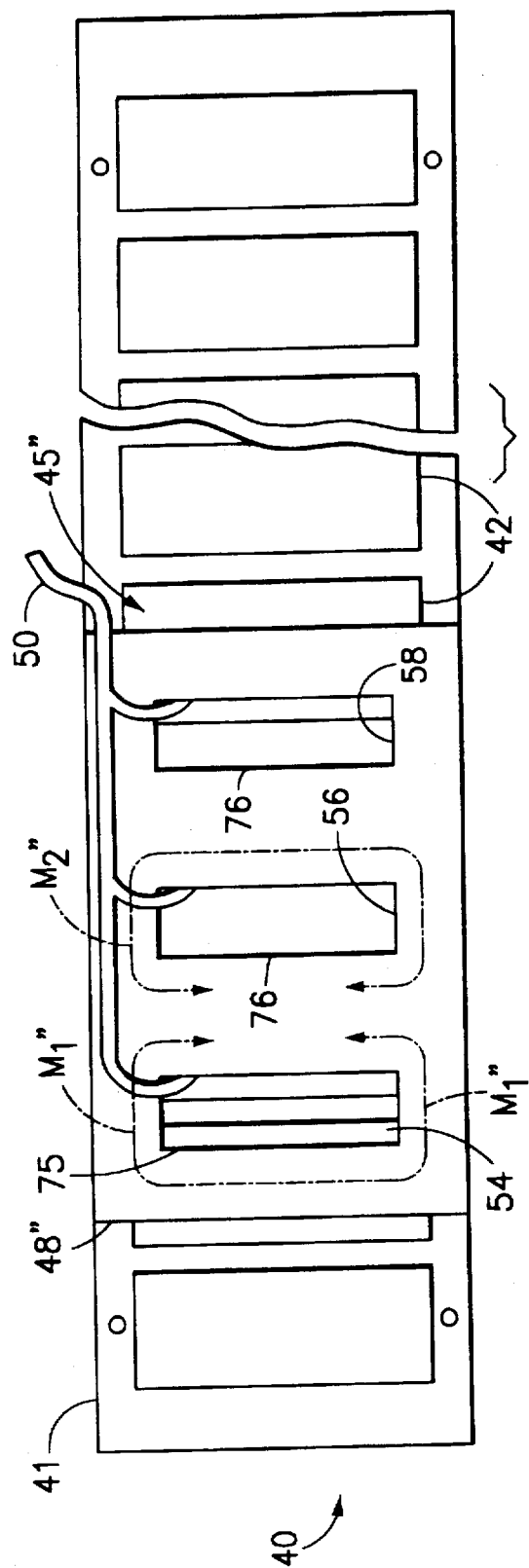
FIG. 5b is a front view of the flat linear motor of FIG. 5a showing magnetic flux lines.

Referring to FIGS. 5a and 5b, yet another embodiment of the present invention is shown which is similar to the embodiment of FIGS. 4a and 4b with the recesses 71, 72, and 73, replaced by slots 75, 76, and 77. The lines of flux $M_1''$ travel around the slots 75, 76, and 77, in order to complete the magnetic circuit of the motor. Thus, the magnetic flux density is similarly concentrated in the areas of the straight lengths of the coils 54, 56, and 58. Furthermore, the slots 75, 76, and 77, provide access to the coils 54, 56, and 58, by the supply cable 50.

In both the embodiments of FIGS. 4a–5b, the spaces of the recesses 71, 72, and 73, and the slots 75, 76, and 77, serve to reduce the weight of the armature thereby allowing greater acceleration with the same force applied, further increasing the efficiency of the motor. This is especially true where the insulating sheet 52 seals off the spaces from the epoxy and the spaces remain empty. The spaces can also be adapted to accept circuit boards or hall effect sensors as required by driver and positioning systems. Furthermore, the slots 71, 72, and 73 provide for improved cooling by permitting increased air circulation over the coils 54, 56, and 58. Although the spaces shown are rectangular it is realized that the shape and relative size of the spaces with respect to the coils may be modified without departing from the scope and spirit of the present invention.

Figure 6A:
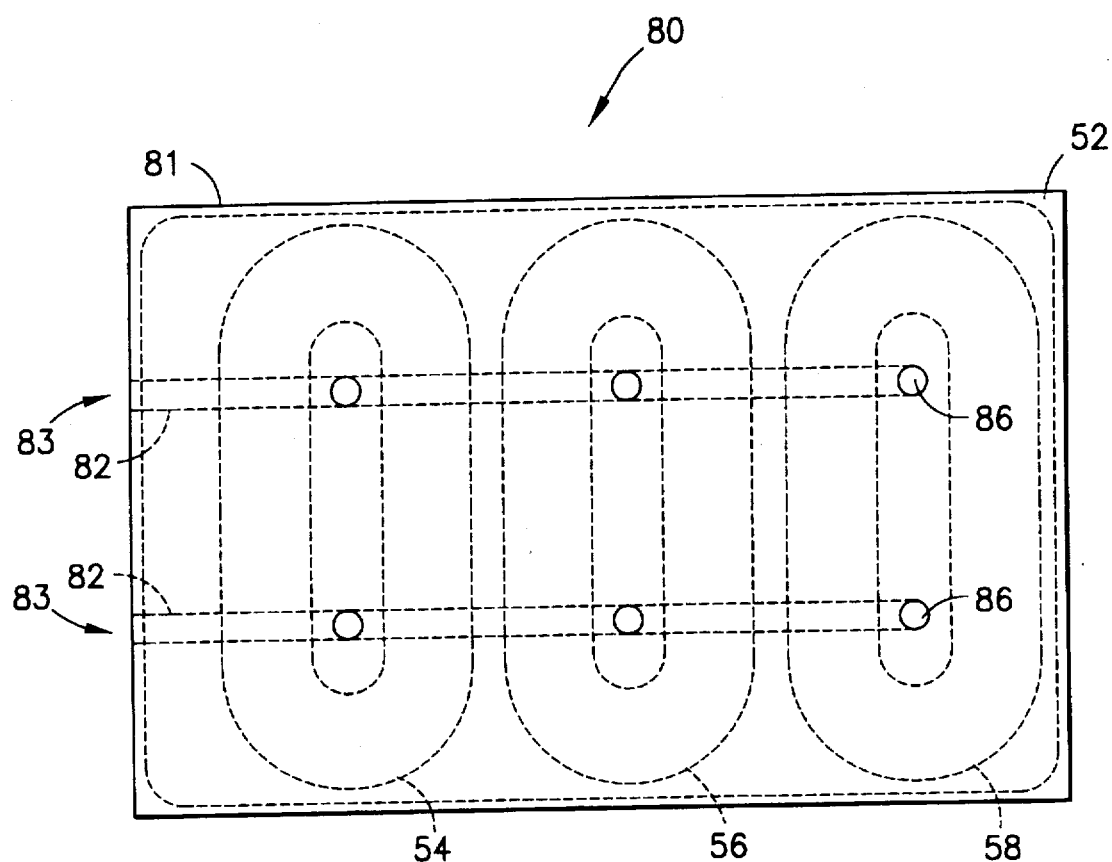
FIG. 6a is a rear view of an armature assembly of the present invention having a cooling manifold.
Figure 6B:
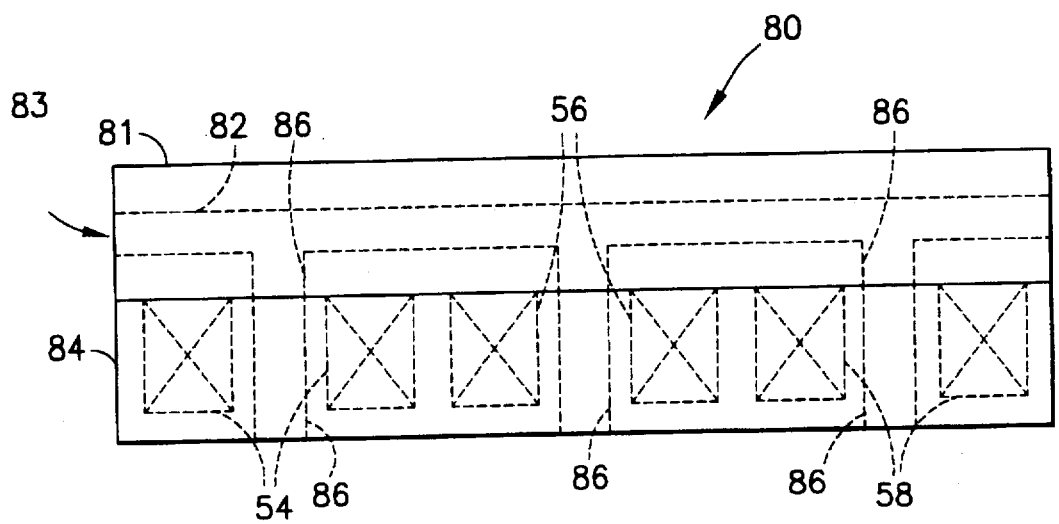

Referring to FIGS. 6a and 6b, an armature assembly 80 of an embodiment of the present invention has an armature backplate 81 with coolant passages 82 formed therein. The coolant passages 82 connect with outlet passages 86 forming a cooling manifold. Air is introduced at inlets 83 and circulates through the armature assembly 80 enroute to exiting through the outlet passages 86. The air carries heat generated within the coils 54, 56, and 58 out of the armature assembly 80 thereby allowing a greater current to be applied to the coils 54, 56, and 58, than in an assembly without a cooling manifold. Two cooling manifolds are shown, however, it is realized that one cooling manifold or a plurality of cooling manifolds may be employed. The cooling manifolds also serve to focus the magnetic flux in the same manner as the recesses 71, 72, and 73 discussed above. The cooling manifolds are formed by boring into the armature assembly following the setting of the epoxy forming the armature block 84. Other methods of constructing the cooling manifold include molding, or machining channels in a surface of the armature backplate 81 which are subsequently enclosed by the insulating sheet 52 and the armature block. Flexible conduits (not shown) are affixed to the inlets and introduce air under pressure.

Figure 7A:
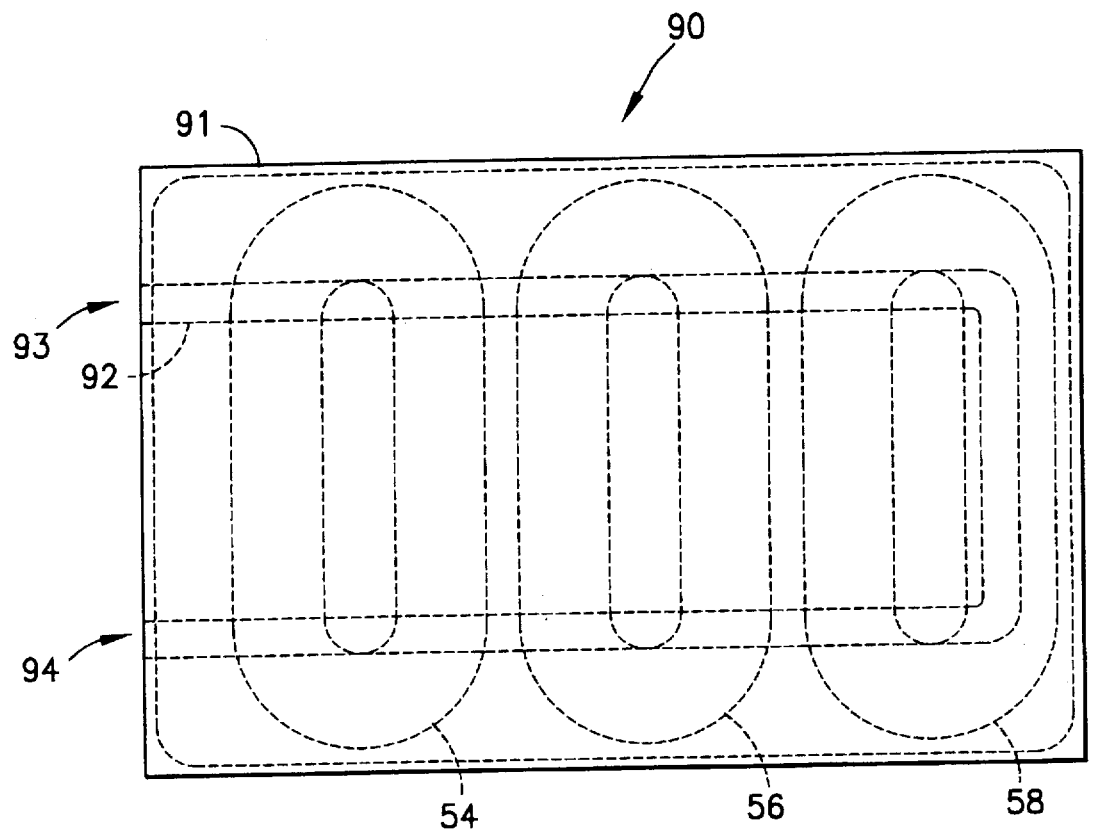
FIG. 7a is a rear view of an armature assembly of the present invention having a cooling passage.
Figure 7B:
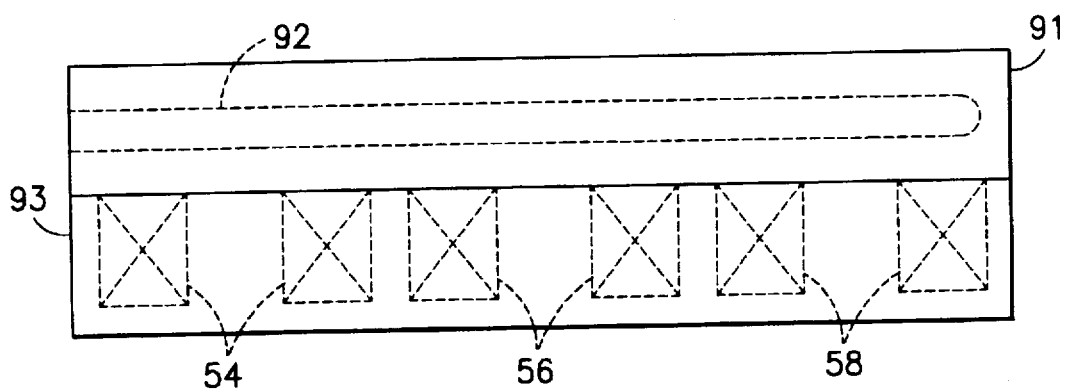

An alternative embodiment of a cooling means is shown in FIGS. 7a and 7b wherein an armature assembly 90 has a coolant passage 92 having a circuitous route through the armature backplate 91. Coolants, including gases and liquids, are introduced at an inlet 93 and exit at outlet 94. Flexible conduits (not shown) are connected to the inlet 93 and outlet 94 and serve to couple the armature assembly 90 to a recirculating system which removes heat from the coolant and pumps it through the armature assembly 90. The coolant passage 92 is formed by the methods discussed above. Where the coolant passage is bored, unnecessary openings are plugged to provide a sealed coolant circuit. Yet another alternative is to fix cooling coils to a back surface of the armature backplate 91.

Figure 8A:
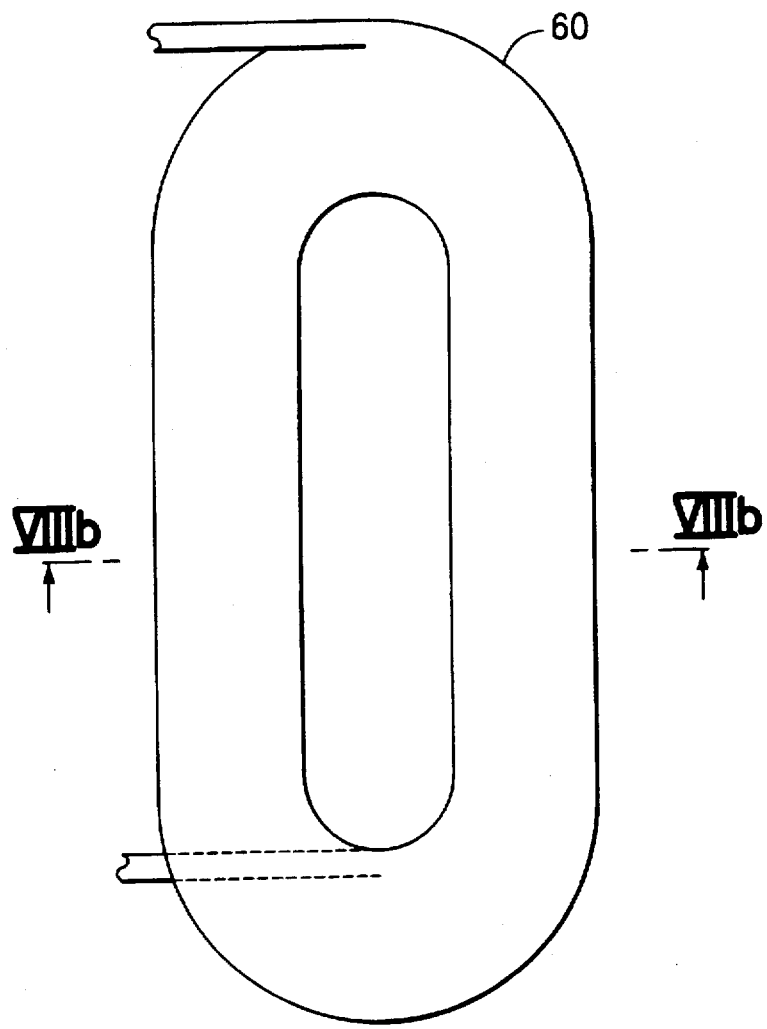
FIG. 8a is a front view of a coil incorporating a feature of the present invention.
Figure 8B:
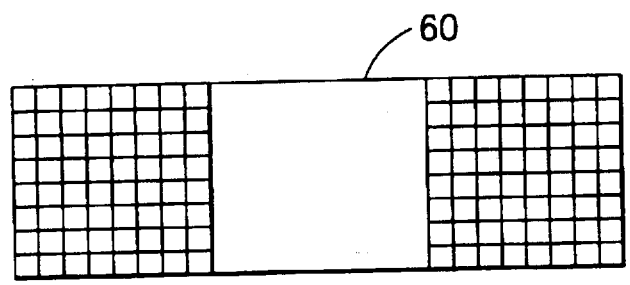
FIG. 8b is a cross-sectional view of the coil of FIG. 8a taken along line VIIIb—VIIIb.

Referring to FIGS. 8a and 8b, a front view and a cross section view is shown of an embodiment of a coil 60 optionally used in the present invention. The coil 60 employs perfect coil construction wherein square wire is used to form the coil 60. In FIG. 2b a compact arrangement of windings of the square wire is shown. No gaps are left between the windings because the wire is square. In windings composed of round wire, gaps are inherently left between adjacent windings. The absence of gaps in the coil 60 allows improved thermal conductivity from inside the coil 60 to its outer windings. Heat is thereby efficiently conducted to the encapsulating epoxy and armature backplate 48 shown in FIG. 3. Furthermore, an electrical resistance of the coil 60 is lowered since the gaps present in coils constructed using round wire are replaced by conductor material, usually copper. The lowered electrical resistance reduces power dissipated due to resistive loses in the coil 60. Alternatively, coils formed of round wire are used where operating specifications do not require the enhanced performance provided by perfect coils formed of round wire.

Referring again to FIG. 2, the present invention eliminates the need to have the two rows of magnets, 18 and 20, and two magnet mount plates, 14 and 16, as shown in the prior art of FIG. 1. Simply eliminating one of the magnet mount plates, 14 or 16, would result in a great reduction in the magnetic flux density B since the magnetic circuit would be composed mainly of air which has a low magnetic permeability in comparison to steel. In FIG. 2, the present invention introduces the armature backplate 48 into magnetic circuits M1 and M2 to provide a path of high magnetic permeability and improved magnetic flux density over a configuration without such a backplate. The armature backplate 48 also provides heat sink capacity drawing heat away from the coils 54, 56, and 58.

The reduced costs associated with the present invention allow use of linear motors in applications where heretofore performance requirements and cost limitations have prevented their use. One such application involves linear movement of a printer head in a dot matrix printer.

In FIGS. 2a and 2b, movement of the armature backplate 48 produces eddy current losses since the armature backplate 48 comprises a portion of magnetic circuits M1 and M2 and is made of a magnetic material. However, it will be realized by one skilled in the art in view of this disclosure that the increase in drag is offset by the increase in force generated by the armature assembly 45 as a result of the greater magnetic flux density B. The utility of the present invention is realized in applications wherein the force and speed requirements are nominal in relation to the required cost constraints. However, where speed requirements are high, the drag due to eddy currents is reduced by manufacturing the armature backplate 48 of laminations formed of high permeability materials.

In order to reduce the effects of cogging in the present invention, the length of the armature backplate 48 is selected as a function of a pitch length of the magnets 42 where the pitch length is equal to a center to center spacing of the magnets 42. The length of the armature backplate 48 is selected to be between 4.3 to 4.7 times the pitch of the magnets 42. The armature backplate 48 is at no time wholly within an integer number of field regions of opposing polarity created by the magnets 42. A fractional interaction with the fields reduces the cogging associated with movement from a position interacting with a first set of fields of an integer number to a second set of fields of such number. Furthermore, cogging is reduced by the separation between the armature backplate 48 and the magnets 42 corresponding to the clearance distance d of 0.05" and a thickness of the armature block 46 of 0.3".

Referring now to FIG. 9, an embodiment of the present invention is shown having a magnet assembly 96 with a first set of magnets 98 polarized (polarization is indicated by an arrow with the head pointing north) perpendicular to the backplate 41 in an alternating sequence. Alternately interposed between the first set of magnets 48 is a second set of magnets 99 which are polarized parallel to the backplate 41 in an alternating sequence. Each of the first set of magnets 98 occupy 70% of a pitch of the backplate assembly 96 while a remaining 30% is occupied by each of the second set of magnets 99. The first and second sets of magnets, 98 and 99, form a modified Halbach array. A Halbach array is described and analyzed in *Design of Permanent Multipole Magnets with Oriented Rare Earth Cobalt Material*, Nuclear Instruments and Methods, 169, 1980, pp. 1–10 by K. Halbach, which is incorporated herein by reference. Progressing from left to right along the magnet assembly as shown, the magnetic orientation of each successive magnet rotates 90° counter-clockwise. This arrangement focuses the magnetic flux toward the armature assembly 45, as indicated by magnetic flux circuits $M_1$ and $M_2$, while minimizing magnetic flux entering the backplate 41. Computer simulation indicates that the magnetic flux density B is increased by approximately 25%. Therefore, 25% more force is produced for the same amount of current. Alternatively, current may be reduce and a heat reduction of up to 50% can be achieved. The Halbach array magnet assembly 96 is used in conjunction with any one of the foregoing embodiments of armature assemblies which incorporate further magnetic flux focusing arrangements or heat dissipating means in order to further enhance performance. According the Halbach reference cited, the percentages of the pitch occupied by the first and second magnets may be varied. For example, according to an embodiment of the invention, the second set occupies at least 60% of the pitch length.

Several methods of commutation may be employed in the present invention. In an embodiment, a hall effect sensor (not shown) is encapsulated in the armature block 46 and is used to sense the polarity of the magnetic fields. Alternatively, another embodiment employs an optical sensor (not shown) mounted upon the armature assembly 45 which detects slots in a card assembly (not shown) mounted upon the magnet assembly 40. The slots are aligned in accordance with polarities of the magnets 42. Such methods are known to those skilled in the art.

A controller receives signals from such sensors and drives the coils 54, 56, and 58, accordingly. A position sensing device, such as an interferometer or a optical sensor functioning in conjunction with an optical grating, is used to sense when the armature assembly 45 has reach a desired position at which time the controller ceases to drive the coils 54, 56, and 58.

Another embodiment of the present invention employs software commutation. An optical sensor (not shown) is mounted upon the armature assembly 45 and scans an optical grating (not shown) mounted along the length of the magnet assembly 40. Other position sensing devices such as an interferometer may similarly be used. At start up, the armature assembly 45 is positioned at a predetermined location along the magnet assembly 40 whereat the field polarity is known. This positioning is accomplished by either mechanical means or by applying current to a single coil thereby forcing it to align with a field polarity known by virtue of the polarity of the field produced by the coil. At this predetermined location a controller is initialized. Armature return devices realizable by those skilled in the art may be employed to ensure start up at the predetermined location.

The controller drives the coils 54, 56, and 58 while monitoring signals from the optical sensor and determining a present position of the armature assembly 45 along the magnet assembly 40. The controller correlates the present position to field polarity using either a formula or a look-up table and drives the armature assembly 45 accordingly. The embodiment thus achieves commutation and position sensing simultaneously and eliminates the need to have both commutation sensors and position sensors. This further reduces the costs of production and assembly.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A flat linear motor comprising:
    a single row of permanent magnets mounted upon a magnet backplate of magnetic material;
    an armature assembly;
    said armature assembly including an armature block;
    said armature block including coils;
    said coils having cores substantially filled with a non-magnetic material;
    a flux focusing block holder composed of a magnetic material;
    said armature block being affixed upon said flux focusing block holder; and
    said flux focusing block holder and said magnet backplate positioned to provide a return path for a magnetic flux emanating from said single row of permanent magnets such that said magnetic flux is confined in said armature block, whereby a low resistance magnetic circuit is formed.

2. The flat linear motor according to claim 1 wherein said coils are non-overlapping.

3. The flat linear motor according to claim 1 wherein said armature block is formed from a settable epoxy resin.

4. The flat linear motor according to claim 1 wherein said flux focusing block holder has a length equal to a non-integral number of pitch lengths of the row of permanent magnets such that cogging is reduced.

5. The flat linear motor according to claim 1 wherein said armature block includes an insulating sheet separating said coils from said flux focusing block holder upon which said armature block is affixed.

6. The flat linear motor according to claim 5 wherein said armature block is formed from a settable epoxy resin.

7. The flat linear motor according to claim 5 wherein:
    said armature block is formed from a settable epoxy resin; and
    said insulating sheet includes apertures allowing said settable epoxy resin to adhere to said flux focusing block holder so that a low thermal resistance contact is achieved.

8. The flat linear motor according to claim 7 wherein said flux focusing block holder includes grooves with which said settable epoxy resin interlocks.

9. The flat linear motor according to claim 1 further comprising:
    a position sensing device for sensing a position of said armature assembly relative to an initialization position;
    a controller receiving signals from said position sensing device;
    said controller including means for determining the position of said armature assembly;
    said controller including means for determining a field polarity of said permanent magnets at said position by means of one of a formula and a look-up table; and
    said controller including means for driving said coils in accordance with the field polarity at said position.

10. The flat linear motor according to claim 1 further comprising:
    said flux focusing block holder having focusing means for focusing said magnetic flux through said coils;
    said focusing means including one of apertures and recesses;
    said coils having center apertures; and
    said focusing means being disposed substantially within an area defined by said center apertures.

11. The flat linear motor according to claim 10 further comprising:
    said flux focusing block holder having anchor means for securing said armature block to said flux focusing blocks holder; and
    said anchor means including one of a protrusion and a recess having locking surfaces for holding said armature block in contact with said flux focusing block holder.

12. The flat linear motor according to claim 11 further comprising:
    said armature assembly including a passage for circulating a coolant for cooling said coils;
    said passage having an outlet passage passing through a center aperture of at least one of said coils; and
    said passage having an inlet for introducing said coolant.

13. The flat linear motor according to claim 10 further comprising:
    said armature assembly including a passage for circulating a coolant for cooling said coils;
    said passage having an outlet passage passing through a center aperture of at least one of said coils; and
    said passage having an inlet for introducing said coolant.

14. The flat linear motor according to claim 1 further comprising:
    said flux focusing block holder having anchor means for securing said armature block to said flux focusing block holder; and
    said anchor means including one of a protrusion and a recess having locking surfaces for holding said armature block in contact with said flux focusing block holder.

15. The flat linear motor according to claim 14 further comprising:
    said armature assembly including a passage for circulating a coolant for cooling said coils;

said passage having an outlet passage passing through a center aperture of at least one of said coils; and said passage having an inlet for introducing said coolant.

16. The flat linear motor according to claim 1 further comprising:

said armature assembly including a passage for circulating a coolant for cooling said coils;

said passage having an outlet passage passing through a center aperture of at least one of said coils; and said passage having an inlet for introducing said coolant.

17. A flat linear motor comprising:

a single row of magnets mounted on a magnet backplate;

said single row of magnets including a first set of magnets and a second set of magnets;

said single row of magnets having alternating ones of said first and second sets of magnets;

said first set of magnets having alternating polarities oriented perpendicular to said single row;

said second set of magnets having alternating polarities oriented parallel to said single row;

each successive polarity of said single row of magnets being oriented such that similar poles are adjacent one another at a surface of said single row facing an armature assembly;

said armature assembly including an armature block;

said armature block including coils;

said coils having cores substantially filled with a non-magnetic material;

a flux focusing block holder composed of a magnetic material;

said armature block being affixed upon said flux focusing block holder; and said flux focusing block holder and said magnet backplate positioned to provide a return path for a magnetic flux emanating from said single row of permanent magnets such that said magnetic flux is confined in said armature block, whereby a low resistance magnetic circuit is formed.

18. The flat linear motor according to claim 17 further comprising:

said flux focusing block holder having focusing means for focusing said magnetic flux through said coils;

said focusing means including one of apertures and recesses;

said coils having center aperture; and said focusing means being disposed substantially within an area defined by said center apertures.

19. The flat linear motor according to claim 17 further comprising:

said flux focusing block holder having anchor means for securing said armature block to said flux focusing block holder; and said anchor means including one of a protrusion and a recess having locking surfaces for holding said armature block in contact with said flux focusing block holder.

20. The flat linear motor according to claim 17 further comprising:

said armature assembly including a passage for circulating a coolant for cooling said coils;

said passage having an outlet passage passing through a center aperture of at least one of said coils; and said passage having an inlet for introducing said coolant.

21. The linear motor according to claim 17 further comprising said first set of magnets occupying at least 60% of a pitch of said single row of magnets.

22. A linear motor according to claim 1, wherein said flux focusing block holder is an armature backplate formed from a magnetic plate.

23. A linear motor according to claim 1, wherein said flux focusing block holder is an armature backplate composed of magnetic laminates.

24. A linear motor according to claim 17, wherein said flux focusing block holder is an armature backplate formed from a magnetic plate.

25. A linear motor according to claim 17, wherein said flux focusing block holder is an armature backplate composed of magnetic laminates.

* * * * *